United States Patent
Koyama et al.

(10) Patent No.: US 8,076,651 B2
(45) Date of Patent: Dec. 13, 2011

(54) SPECIMEN STAGE APPARATUS AND SPECIMEN STAGE POSITIONING CONTROL METHOD

(75) Inventors: Masahiro Koyama, Tsuchiura (JP); Hironori Ogawa, Hitachinaka (JP); Nobuo Shibata, Kasumigaura (JP); Masaru Matsushima, Hitachinaka (JP); Toshinori Kobayashi, Hitachinaka (JP); Shuichi Nakagawa, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 343 days.

(21) Appl. No.: 12/415,720

(22) Filed: Mar. 31, 2009

(65) Prior Publication Data

US 2009/0250625 A1 Oct. 8, 2009

(30) Foreign Application Priority Data

Apr. 2, 2008 (JP) .................. 2008-095649

(51) Int. Cl.
*H01J 37/20* (2006.01)
(52) U.S. Cl. .................. 250/442.11
(58) Field of Classification Search ......... 250/442.11, 250/310
See application file for complete search history.

(56) References Cited

U.S. PATENT DOCUMENTS 5,040,431 A * 8/1991 Sakino et al. .......... 74/490.09
7,435,974 B2 10/2008 Matsushima
7,900,896 B2 * 3/2011 Fujita ................... 269/58

FOREIGN PATENT DOCUMENTS

| JP | 03-061728 | 3/1991 |
|---|---|---|
| JP | 08-222500 | 8/1996 |
| JP | 2001-069773 A | 3/2001 |
| JP | 2001-088695 | 4/2001 |
| JP | 2001-225241 | 8/2001 |

OTHER PUBLICATIONS

Japanese Office Action, w/ partial English translation thereof, issued in Japanese Patent Application No. JP 2008-095649 dated Jul. 9, 2010.

Japanese Office Action, w/ partial English translation thereof, issued in Japanese Patent Application No. JP 2008-095649 dated Feb. 10, 2011.

* cited by examiner

*Primary Examiner* — Kiet T Nguyen

(74) *Attorney, Agent, or Firm* — McDermott Will & Emery LLP

(57) ABSTRACT

A specimen stage apparatus has a braking structure which can generate a braking force enough to stop a specimen stage while keeping a movable table from increasing in its weight. The specimen stage apparatus has an X guide fixed on an X base and representing a guide structure in X direction, an X table constrained by the X guide to be movable in X direction, an X actuator having its movable part fixed to the X table and an X brake fixed to the X base and representing a braking structure for the X table. A controller carries out positioning control in which it generates a braking force by pushing the X brake against the bottom surface of the X table to stop a specimen stage and turning off the servo-control of the X actuator after stoppage of the specimen stage.

4 Claims, 5 Drawing Sheets

SPECIMEN STAGE APPARATUS AND SPECIMEN STAGE POSITIONING CONTROL METHOD

BACKGROUND OF THE INVENTION

The present invention relates to a specimen stage apparatus suitable as a specimen stage of an electron microscope used especially for inspecting and evaluating semiconductors in the field of semiconductor manufacture, an electron microscope provided with the specimen stage apparatus and a specimen stage apparatus positioning control method.

With semiconductor devices minified in recent years, not only the manufacturing apparatus but also the inspecting/evaluating apparatus has been required of high accuracy comparable to that of the manufacturing apparatus. Typically, in order to evaluate whether or not the shape critical dimension of a pattern formed on a semiconductor wafer is correct, a scanning electron microscope with the critical dimensioning function (hereinafter referred to as a critical dimensioning SEM) has been used.

In the critical dimensioning SEM, an electron beam is irradiated on a wafer, a captured secondary electron signal is processed to an image and the edge of a pattern is determined from a bright to dark change or vice versa to extract a critical dimension. In this case, it is important for coping with the minified formation of the semiconductor device to obtain a secondary electron image of less noise at high magnifications for observation. Accordingly, many secondary electron images need to be superimposed on one another to improve the contrast and to this end, the specimen stage carrying and holding the wafer is required to be suppressed in its vibration and drift in the order of nanometer.

Achieving the aforementioned suppression in vibration and drift necessitates a specimen stage apparatus capable of performing highly accurate positioning and generally, this type of specimen stage apparatus is comprised of a servo-control system adopting a linear motor as drive mechanism.

In carrying out the servo-control, however, a slight or minute vibration is occurring in the order of nanometer even in the stop condition, so that the specimen stage vibrates to vary the specimen position and besides, the vibration of the specimen stage causes the whole apparatus to vibrate and therefore, the secondary electron image will sometimes be affected adversely.

As a countermeasure against a minute vibration attributable to the servo-control as above, a technique is available in which a braking structure is provided for a movable table of the specimen stage and when stopping the specimen stage, braking is activated to turn off the servo-control (see JP-A-2001-88695 (paragraphs [0010] to [0016], FIGS. 1 to 4), for example). In the known technique, the movable table is provided with a brake driven by an air cylinder and the movable table clamps together, with the help of braking, a plate member laid along the direction in which the movable table moves, thus making it possible to brake the movable table.

In another technique different from the above one, a movable table is provided with a rolling member acting on the base surface and when stopping the specimen stage, the thrust force of the rolling member applied on the base surface is increased with the help of a force generated by a piezoelectric device provided for the movable table, so that the movable table is braked (see JP-A-8-222500 (paragraphs [0025] to [0028], FIGS. 4 to 5), for example).

SUMMARY OF THE INVENTION

According to the technique disclosed in JP-A-2001-88695, however, the braking structure is carried on the movable table, with the movable table integral weight increased and a motor for driving the movable table must generate a high propulsive force. Besides, in the environment of the interior of a specimen chamber of the aforementioned critical dimensioning SEM, which environment is evacuated to vacuum, the air inlet pipe for the air cylinder must be designed with special care. This leads to a problem that the specimen stage apparatus becomes costly.

According to the technique disclosed in JP-A-8-222500, however, the braking structure is carried on the movable table similarly to the braking structure described in JP-A-2001-88695, increasing the integral weight of the movable table and necessitating a motor of high propulsive force. Further, in order to increase the braking force by increasing the thrust force of the rolling member, the piezoelectric device capable of generating a large force is needed. This leads to a problem that the specimen stage apparatus becomes costly as in the case of the technique described in JP-A-2001-88695.

The present invention intends to solve the above problems and an object of this invention is to provide a specimen stage apparatus applicable to an apparatus for inspecting and evaluating semiconductors such as the aforementioned critical dimensioning SEM, the specimen stage apparatus comprising a braking structure which can prevent a movable table from additionally increasing in weight so as to attain inexpensiveness and which generates a braking force sufficient to suppress slight vibrations and drifts at the time of stopping a specimen stage, and to provide a specimen stage positioning control method as well.

To accomplish the above object, according to the present invention, an X or Y base carries a structure for guiding a movable table and a braking structure is provided having a plate member which is pushed against the surface of movable table opposing the base by a constant force of a spring to generate a braking force, whereby at the time of moving a specimen stage, the plate member of the braking structure is freed from contact with the movable table by a driving force larger than the spring force to thereby release the braking force. Then, at the time of stopping the specimen stage, positioning control is carried out in which the driving force larger than the spring force is released to enable the plate member of the braking structure to be again pushed against the movable table by the constant spring force, generating the braking force by which the movable table is stopped, and besides, the servo-control is turned off immediately after stoppage of the specimen stage.

Since according to the present invention the braking structure is not carried on the movable table but is attached to the base, the weight of the movable table does not increase and the necessary propulsive force of the motor need not be increased. Further, the drive expedient of braking structure can be cheap and simplified by using the compression spring and the expensiveness of the specimen stage apparatus can be suppressed.

Further, at the time of stopping the specimen stage, setting time for positioning of the movable table can be shortened by the braking force of the braking structure and besides, by turning off the servo-control immediately after stoppage of the specimen stage, the slight vibration attributable to the servo-control can be eliminated and the drift after specimen stage stoppage can be suppressed by the sufficient braking force of the brake.

Other objects, features and advantages of the invention will become apparent from the following description of the embodiments of the invention taken in conjunction with the accompanying drawings.

DETAILED DESCRIPTION OF THE INVENTION

With reference to the accompanying drawings of FIGS. 1 to 6, a specimen stage apparatus and specimen stage positioning method according to an embodiment of the invention will be described in greater detail.

Figure 1:
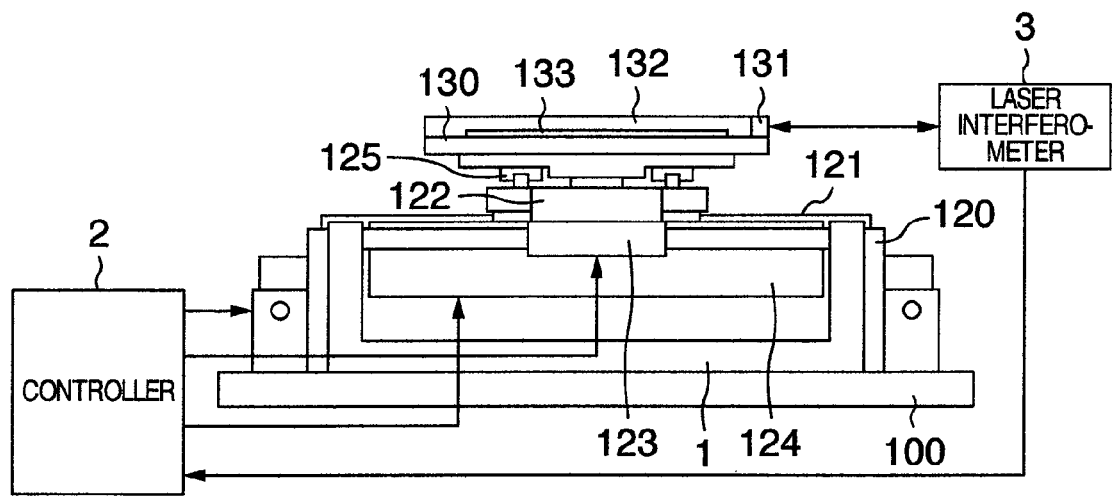
FIG. 1 is a side view showing the overall construction of a specimen stage apparatus according to an embodiment of the present invention.

Referring first to FIG. 1, the specimen stage apparatus according to the present embodiment is constructed as a whole as illustrated in side view form therein. As shown, the specimen stage apparatus comprises a specimen stage mechanism 1, a controller 2 therefor and a laser interferometer 3 for detecting the positions of tables so mounted on the specimen stage mechanism 1 as to be movable in X and Y directions (hereinafter referred to as movable tables).

Figure 2:
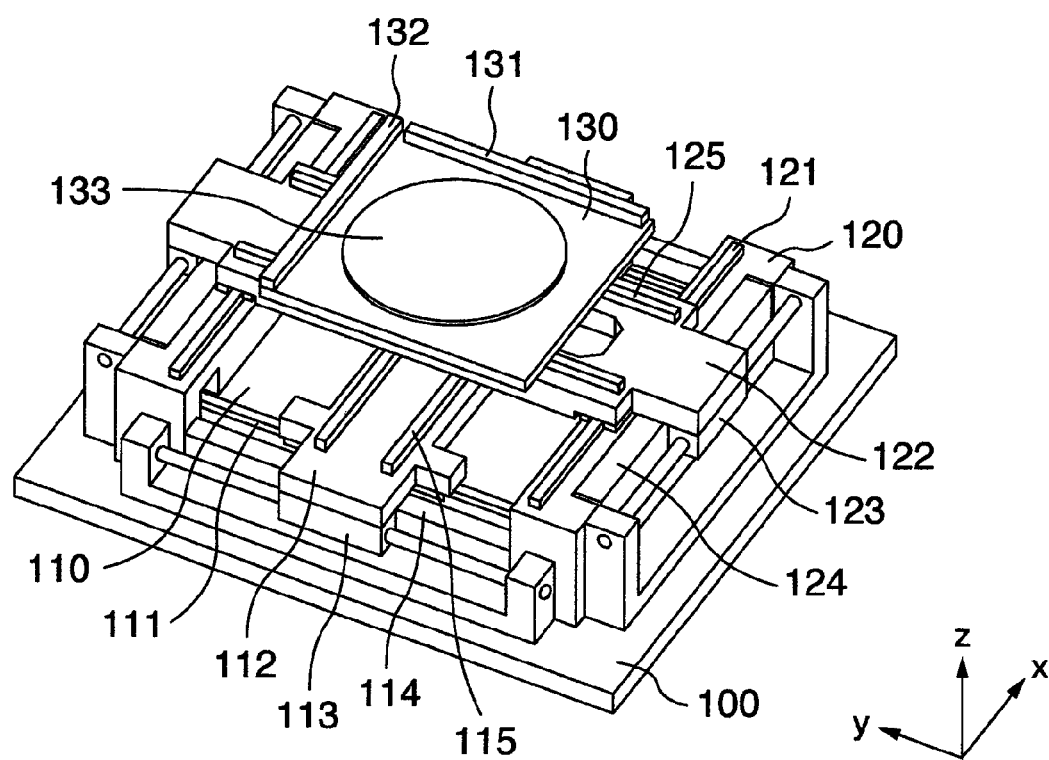
FIG. 2 is a perspective view schematically showing a specimen stage mechanism in the present embodiment.

The specimen stage mechanism in the present embodiment is schematically illustrated in perspective view form in FIG. 2.

In FIG. 2, the specimen stage mechanism 1 carries on a base 100 the movable tables and mechanisms for driving them. Firstly, a Y base 110 is fixed on the base 100 and Y guides 111 constituting a guide structure in Y direction (Y direction of coordinate axis shown in FIG. 2) are fixed on the Y base 110. In FIG. 2, the Y guides 111, three in total, are provided in the center (not shown) and near the opposite ends in X direction of the Y base 110, respectively. A Y table 112 is constrained by the Y guides 111 to be movable in only Y direction. The Y table 112 is caused to perform linear motion by a propulsive force generated by a Y actuator 113 having its movable part fixed to the Y table 112. The Y actuator 113 has its stationary part fixed on the base 100. As the Y actuator 113, a linear motor, for example, may be utilized. Further, a Y brake 114 representing a braking structure for stopping the Y table 112 is fixed to the base 110. In FIG. 2, the Y actuators 113 and Y brakes 114 are both provided near the longitudinally opposite ends of the Y table 112. If the necessary propulsive force and braking force can be obtained, the Y actuators and Y brakes need not always be provided for the longitudinally opposite ends but the Y actuator and Y brake may be provided for only any one of the ends.

As will be described later, the Y brake 114 is a structure having a plate member which is pushed against the bottom surface of Y table 112 by a predetermined force of a spring to generate a braking force and by controlling the contact/non-contact status of the plate member to the Y table 112, the presence/absence of braking force can be switched. In this manner, the Y brake 114 is not carried on the Y table 112 representing the movable table but is attached to the fixed Y base 110, so that the weight of the movable table does not increase and the necessary propulsive force of Y actuator 113 need not be increased. Accordingly, the expensiveness of the specimen stage apparatus attributable to the addition of the braking structure can be suppressed.

Mounted on the Y table 112 are X sub-guides 115 constituting a guide structure in X direction orthogonal to Y direction. In FIG. 2, two X sub-guides 115 are provided. A sub-table 116 (not shown) is constrained by the X sub-guides 115 to be movable in the X direction. The sub-table 116, together with a top table 130 coupled thereto, performs linear motion in the X direction on the X sub-guides 115.

Also fixed onto the base 100 is an X base 120 on which an X guide 121 representing a guide structure in the X direction is fixed. In FIG. 2, the X base 120 is provided in the form of two members sandwiching the Y base 110 and one X guide 121 is provided for each of the X bases 120, amounting to two in total. An X table 122 is constrained by the X guide 121 to be movable in only X direction. The X table 122 is caused to perform linear motion by a propulsive force generated by an X actuator 123 having its movable part fixed to the X table 122. The X actuator 123 has its stationary part fixed onto the base 100. As the X actuator 123, a linear motor, for example, may be utilized. Further, an X brake 124 representing a braking structure for stopping the X table 122 is fixedly attached to the X base 120. In FIG. 2, the X actuators 123 and X brakes 124 are both provided near the longitudinally opposite ends of the X table 122. If the necessary propulsive force and braking force can be obtained, the X actuator and X brake may be provided for only any one of the ends of the X table 122.

Like the Y brake 114, the X brake 124 is a structure having a plate member which is pushed against the bottom surface of X table 122 by a predetermined force of a spring to generate a braking force and the presence/absence of the braking force can be switched.

Mounted on the X table 122 are Y sub-guides 125 constituting a guide structure in Y direction orthogonal to X direction. In FIG. 2, two Y sub-guides 125 are provided. The top table 130 is constrained by the Y sub-guides 125 to be movable in the Y direction. The top table 130, together with motion of the sub-table 116 (not shown) coupled thereto, performs linear motion in the Y direction on the Y sub-guides 125.

With the construction described as above, the X table 122 and Y table 112 move individually to permit the top table 130 to move two-dimensionally in the X and Y directions. Mounted on the top table 130 are fixed mirrors (X mirror 131 and Y mirror 132) cooperative with the laser interferometer 3 to measure the position of the top table 130 and a specimen holder 133.

For simplification of explanation, the specimen stage mechanism 1 is illustrated in side view form as seen in the Y direction in FIG. 1 and now positioning control in the X direction will be outlined hereunder.

Firstly, operation of top table 130 in the X direction is determined by operation of X actuator 123 for driving the X table 122. Namely, as the movable part of X actuator 123 moves linearly in the X direction, the X table 122 fixed thereto moves while being guided by the X guide 121 and concurrently therewith, the top table 130 constrained by the Y sub-guide 125 mounted on the X table 122 moves in the X direction. In order for the servo-control unit of controller 2 to execute servo-control of the position, speed and propulsive force of the X actuator 123 and positions of the top table 130 in the X direction are measured by means of the laser interferometer 3 and fed back to the servo-control unit of the controller 2. The servo-control unit delivers a drive current for generating a propulsive force of the X actuator 123.

When the movement of the top table 130 starts, the braking force by the X brake 124 fixed to the X base 120 is released (hereinafter, referred to as brake-off) and when positioning the top table 130, the braking force of X brake 124 is generated (hereinafter referred to as brake-on) as the positional deviation of top table 130 in the X direction comes into a predetermined constant permissible range, thus stopping the X table 122. Further, by turning off the servo-control (hereinafter referred to as servo-off) immediately after the stoppage of the X table 122, the slight vibration due to the servo-control can be eliminated and the drift after the stoppage of the X table 122 can be suppressed by the braking force of the X brake 124. The brake on/off control as above is executed by the brake control unit of controller 2, from which a brake drive signal is outputted.

Figure 3:
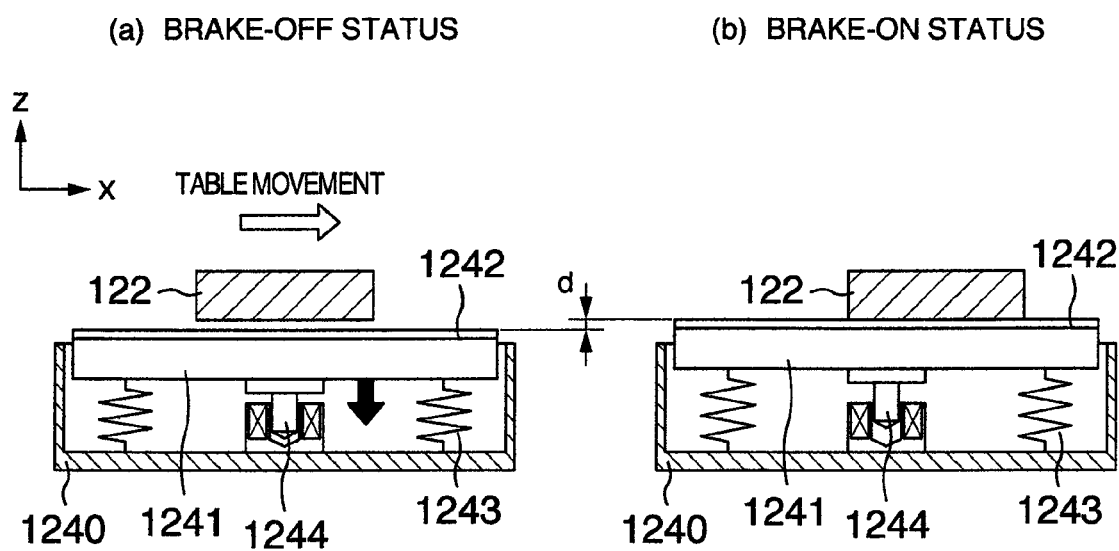
FIG. 3 is a diagrammatic representation showing the specimen stage mechanism in the present embodiment.

The braking structure in the present embodiment is diagrammatically functionally illustrated in FIG. 3. Here, for explanation of the operational principle of the braking structure, the sectional structure and operational outline are illustrated diagrammatically by taking the X brake 124, for instance. The structure and operation to be described below can be quite the same for the Y brake 114.

In FIG. 3, a compression coil spring 1243 and an attraction type actuator 1244 are fixed on a brake base 1240 and a movable plate member 1241 is fixed to upper ends of these members. A brake pad 1242 is attached onto the movable plate member 1241, forming a member which comes into contact with the movable table (in this case, X table 122). As will be seen from the above, the drive expedient of the braking structure can be cheap and simple by using the compression coil spring 1243 and attraction type actuator 1244 and therefore the expensiveness of the specimen stage can be suppressed.

As shown at (a) in FIG. 3, by a propulsive force generated by the attraction type actuator 1244, the movable plate member 1241 is drawn downwards in opposition to a spring force the compression coil spring 1243 exerts and as a result, the bottom surface of the X table 122 does not contact the brake pad 1242. This sets up the brake-off status. At that time, a draw-down amount d of the movable plate member 1241 corresponds to an operation amount of the attraction type actuator 1244 and the spring force determined by the sum of a biased initial displacement by compression coil spring 1243 and the draw-down amount d corresponds to the necessary propulsive force of the attraction type actuator 1244. As the X table 122 starts moving, the brake-off is set up in this manner. In the brake-off condition, the attraction type actuator 1244 keeps generating the propulsive force.

As shown at (b) in FIG. 3, the propulsive force of the attraction type actuator 1244 is released, the movable plate member 1241 is pushed upwards by the spring force of compression coil spring 1243 and the brake pad 1242 is pushed against the bottom surface of the X table 122. Thus, the brake-on status is established. In this condition, the baking force acting on the bottom surface of X table 122 is determined by a frictional force obtained through multiplication of a net thrust force by a coefficient of friction between the brake pad 1242 and the bottom surface of X table 122, the net thrust force being the sum of a difference of subtraction of weights of the movable plate member 1241 and brake pad 1242 from the spring force due to the initial displacement of the compression coil spring 1243. When positioning the X table 122, the X brake 124 is brought into brake-on status in this manner to thereby stop the X table 122. Further, the drift occurring after the stoppage of X table can be suppressed with the help of the braking force of the X brake 124.

As the attraction type actuator 1244 shown in FIG. 3, an electromagnetic solenoid of current conduction attraction type or a voice coil motor, for example, can be utilized. Putting aside the structure as shown in FIG. 3 in which the movable plate member 1241 is drawn downwards by the attraction type actuator 1244 to establish the brake-off status, another mechanism may be adoptable which is constructed by using, for example, a rotary motor and a cam mechanism or gear mechanism in combination.

While in FIG. 3 the braking structure using the compression coil spring 1243 has been shown, another type of braking structure using a leaf spring in place of the compression coil spring 1243 may be constructed.

Figure 4:
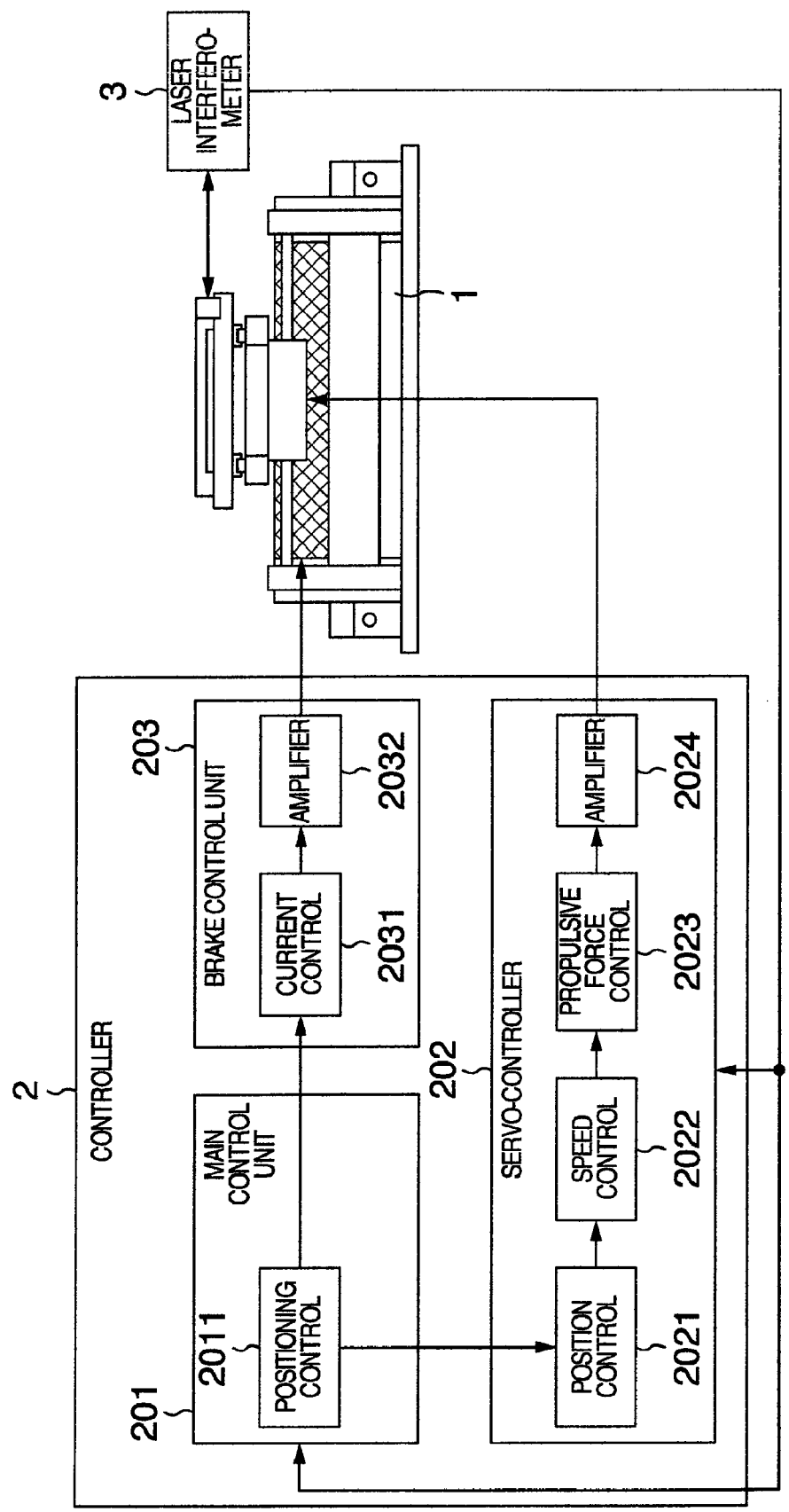
FIG. 4 is a block diagram schematically showing the construction of a controller in the specimen stage apparatus according to the present embodiment.

Turning to FIG. 4, the controller in the specimen stage apparatus of the present embodiment is constructed as illustrated in schematic block diagram form therein.

In FIG. 4, the controller 2 includes a main control unit 201, a servo-control unit 202 and a brake control unit 203. The servo-control unit 202 has a position control section 2021, a speed control section 2022 and a propulsive force control section 2023 and in the respective sections, operations of position control loop, speed control loop and propulsive force control loop are executed on the basis of the position information of specimen stage mechanism 1 which is measured by the laser interferometer 3. An actuator drive command determined as a result of the operations is delivered via an amplifier 2024 to the actuators (123 and 113) adapted to drive the X table 122 and Y table 112 of specimen stage mechanism 1, respectively.

The brake control unit 203 has a current control section 2031 and amplifier 2032 which are adapted to control the propulsive force of the attraction type actuator 1244 in the braking structure shown in FIG. 3. In the current control section 2031, the drive current is so adjusted as to gradually decrease the propulsive force of the attraction type actuator 1244 in order that the thrust force against the bottom surface of the movable table (X table 122 in FIG. 3) does not act abruptly in the course of transition of the brake-off status to the brake-on status, the thus adjusted drive current being delivered to the attraction type actuator 1244 via the amplifier 2032. Through the current control as above, the thrust force acting on the bottom surface of the movable table can be increased continuously and as a result, the braking force against the movable table can be increased continuously. For example, when the electromagnetic solenoid of current conduction attraction type is used as the attraction type actuator 1244, the current control can be carried out in such a manner that the maximum current is conducted through the coil at the time of brake-off, the coil current is decreased gradually in the course of transition from the brake-off to the brake-on and no current is passed through the coil at the time of complete brake-on.

The main control unit 201 has a positioning control section 2011, from which the function of servo-control unit 202 and that of the brake control unit 203 are called out and the specimen stage positioning control is executed while switching the servo-on/off and the brake on/off.

Figure 5:
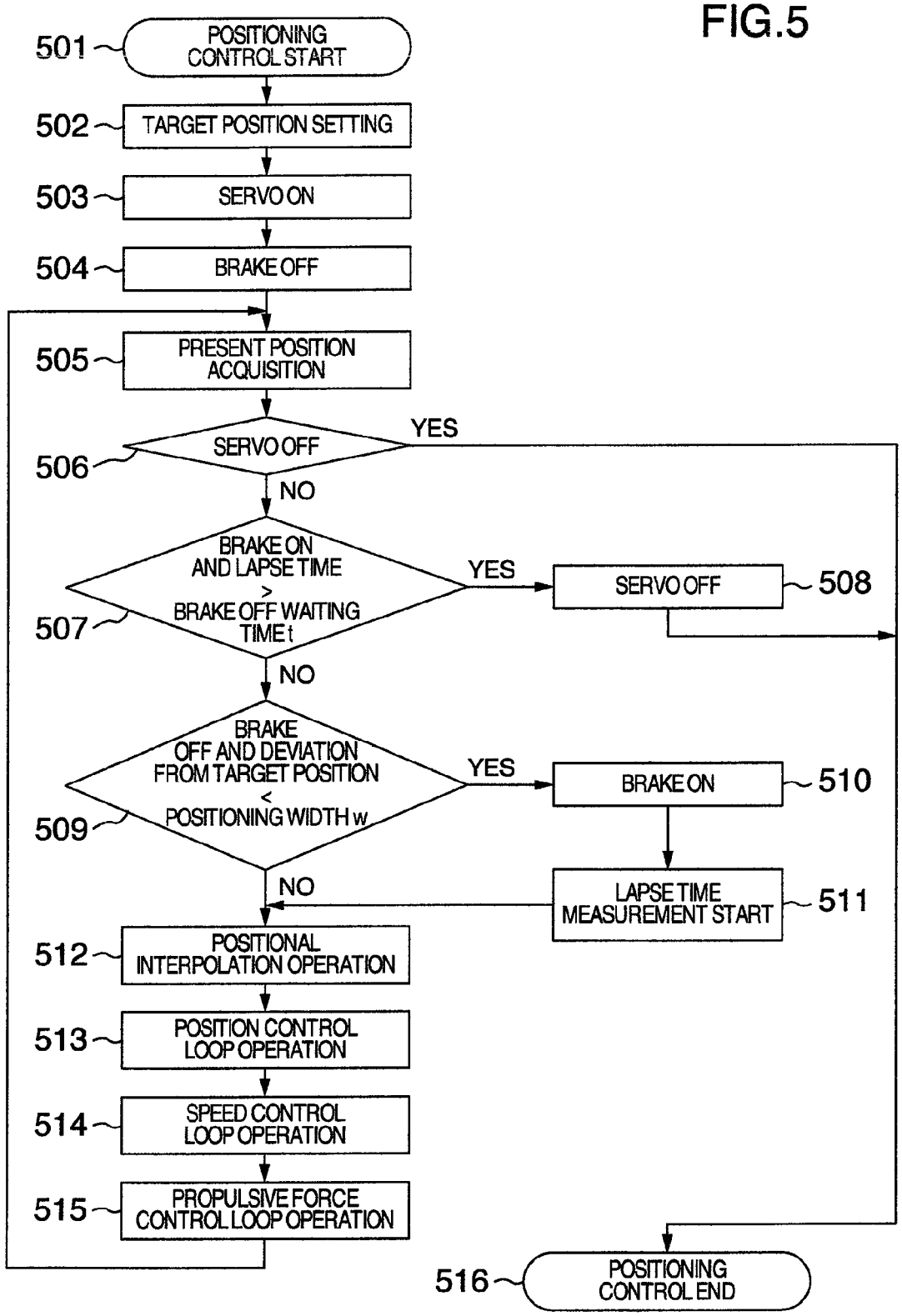
FIG. 5 is a flowchart showing the procedures of executing a specimen stage positioning method in the present embodiment.
Figure 6:
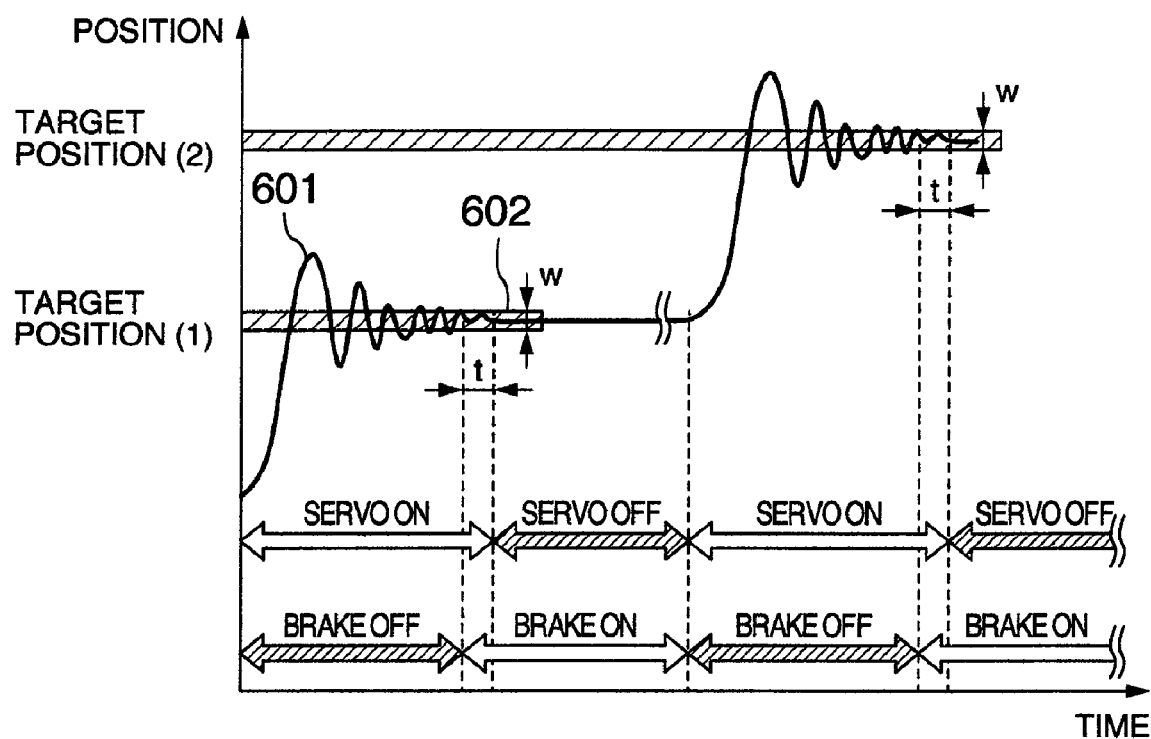
FIG. 6 is a time chart showing an example of a time response waveform of the position of the specimen stage during the specimen stage positioning executed in accordance with the specimen stage positioning control method in the present embodiment.

Referring to FIG. 5, there is illustrated a flowchart showing the procedures of execution of the specimen stage positioning control method in the present embodiment. Illustrated in FIG. 6 is a time chart showing an example of a time response waveform of the position of the specimen stage when executing the specimen stage positioning in accordance with the specimen stage positioning control method in the present embodiment. The specimen stage positioning control method according to the present embodiment will be described by making reference to FIGS. 5 and 6.

According to the flowchart shown in FIG. 5, when the positioning control is started (step 501), setting of a target position is first executed (step 502). Specifically, the target position is set by designating a coordinate value registered in advance in a master apparatus or a coordinate value indicated by the operator through manual input or by designating a coordinate value indicated by the cursor on the screen.

Next, the actuator for driving the specimen stage is caused to undergo servo-on (step 503) and then the brake-off is set up (step 504). Then, a position at present of the specimen stage is captured by means of the laser interferometer 3 (step 505) and when the specimen stage starts moving, a movement distance is determined from a difference between the target position and the present position and on the basis of a predetermined speed pattern, positional interpolation calculation is executed every interpolation period (step 512). Position control loop operation is executed by using a position determined through the positional interpolation operation as a target value per control period (step 513), speed control loop operation is executed by using the position control loop output as the target value (514) and further, propulsive force control loop operation is executed by using the speed control loop output as the target value (step 515). It will be appreciated that the control loop operations (steps 513, 514 and 515) are packaged as interruption processes at the respective control periods and therefore, the steps 513, 514 and 515 are not executed sequentially at the same timing. This also applies to the step 512.

In FIG. 6, the behavior of the specimen stage is illustrated and when the specimen stage starts to move to the target position, the servo-on and brake-off are set up and as indicated by a time response curve 601 of position, the specimen stage approaches the target position as the time elapses. As shown in the figure, when the specimen stage reaches the vicinity of the target position, positive-going and negative-going overshoots take place in relation to the target position, exhibiting a vibratory behavior. According to the flowchart shown in FIG. 5, in order to adjust vibrations as such within a short period of time, when the deviation of the target position from the present position falls within a preset constant positioning width w (a region 602 shown in FIG. 6) (step 509), the brake-on is set up (step 510) to apply braking to the specimen stage. Then, measurement of a time elapsing from the brake-on time point is started (step 511). When the lapse time subsequently exceeds a preset constant waiting time t, the actuator is brought into the servo-off (step 508). This ensures that slight vibrations attributable to the servo-control following the specimen stage stoppage can be eliminated. With the servo-off status settled (step 508), a series of processes concerning the positioning control end (step 516). As shown in FIG. 6, as far as the specimen stage keeps on stopping after arriving at the target position, the servo-off and brake-on states remain unchanged.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A specimen stage apparatus comprising:
   an X or Y base fixed to a specimen stage apparatus base;
   a guide structure provided on said base;
   a movable table which moves along said guide structure;
   a drive mechanisms for driving said movable table;
   a specimen stage mechanism provided for said base and comprised of a braking structure for braking said movable table;
   a position detector for measuring positions of said movable table; and
   a controller adapted to carry out positioning control of said movable table by performing servo-control of said drive mechanisms on the basis of a deviation between a position of said movable table measured by said position detector and a preset target position and by controlling generation of the braking force of said braking structure.

2. A specimen stage apparatus according to claim 1, wherein said braking structure is fixed to said base and it generates the braking force by pushing, by a constant spring force, a plate member against a surface of movable table opposing said base and releases said braking force by setting up non-contact condition between said plate member and said movable table by a driving force larger than said constant spring force.

3. A specimen stage apparatus according to claim 1, wherein said controller releases the braking force of said braking structure as said movable table starts moving, generates the braking force of said braking structure to stop said movable table when the deviation between the position of said movable table and said target position falls below a preset positioning width and turns off the servo-control of said drive mechanism immediately after stoppage of said movable table.

4. A specimen stage positioning control method in a specimen stage apparatus having a fixed base, a guide structure provided on said base, a movable table which moves along said guide structure, a specimen stage mechanism provided for said base and comprised of a braking structure for braking said movable table, a position detector for measuring positions of said movable table and a controller adapted to carry out positioning control of said movable table, wherein said controller comprises the steps of:
   performing servo-control of a drive mechanism on the basis of a deviation between a position of said movable table measured by said position detector and a preset target position;
   generating the braking force of said braking structure to stop said movable table when the deviation falls below a preset positioning width; and
   turning off the servo-control of said drive mechanism immediately after stoppage of said movable table.

* * * * *